United States Patent [19]
Kerzman et al.

[11] Patent Number: 5,912,820
[45] Date of Patent: Jun. 15, 1999

[54] METHOD AND APPARATUS FOR DISTRIBUTING A CLOCK TREE WITHIN A HIERARCHICAL CIRCUIT DESIGN

[75] Inventors: Joseph P. Kerzman, New Brighton; James E. Rezek, Mounds View; John T. Rusterholz, Roseville, all of Minn.

[73] Assignee: Unisys Corporation, Blue Bell, Pa.

[21] Appl. No.: 08/786,851

[22] Filed: Jan. 22, 1997

[51] Int. Cl.⁶ .................................................. G06F 17/50
[52] U.S. Cl. ......................... 364/489; 364/490; 364/491
[58] Field of Search .................................. 364/488–491, 364/578

[56] References Cited

U.S. PATENT DOCUMENTS

| | | | |
|---|---|---|---|
| 4,758,953 | 7/1988 | Morita et al. | 364/300 |
| 4,831,543 | 5/1989 | Mastellone | 364/489 |
| 4,918,614 | 4/1990 | Modarres et al. | 364/490 |
| 5,050,091 | 9/1991 | Rubin | 364/488 |
| 5,077,676 | 12/1991 | Johnson et al. | 364/489 |
| 5,164,908 | 11/1992 | Igarashi | 364/491 |
| 5,175,696 | 12/1992 | Hooper et al. | 364/489 |
| 5,222,029 | 6/1993 | Hooper et al. | 364/489 |
| 5,255,363 | 10/1993 | Seyler | 395/164 |
| 5,264,382 | 11/1993 | Watanable | 437/41 |
| 5,267,175 | 11/1993 | Hooper | 364/489 |
| 5,341,309 | 8/1994 | Kawata | 364/489 |
| 5,349,659 | 9/1994 | Do et al. | 395/700 |
| 5,355,317 | 10/1994 | Talbott et al. | 384/468 |
| 5,357,440 | 10/1994 | Talbott et al. | 364/467 |
| 5,359,523 | 10/1994 | Talbott et al. | 364/468 |
| 5,359,537 | 10/1994 | Saucier et al. | 364/489 |
| 5,361,357 | 11/1994 | Kionka | 395/700 |
| 5,398,195 | 3/1995 | Kim | 364/491 |
| 5,406,497 | 4/1995 | Altheimer et al. | 364/489 |
| 5,410,491 | 4/1995 | Minami | 364/491 |
| 5,416,721 | 5/1995 | Nishiyama et al. | 364/491 |
| 5,418,733 | 5/1995 | Kamijima | 364/490 |

(List continued on next page.)

OTHER PUBLICATIONS

Davari et al "A New Planarization Technique, Using a Combination of Rie and Chemical Mechanical Polish (CMP)," IEEE, pp. 3.4.1–3.4.4, Dec. 1989.

Cho et al. ("A buffer distribtuion algorithm for high–performance clock net optimization", IEEE Transactions on Very Large Scale Integration (VLSI) Systems, IEEE, vol. 3, No. 1, pp. 84–98, Mar. 1995).

Chen et al. ("An algorithm for zero–skew clock tree routing with buffer insertion", IEEE Comput. Soc. Press, Proceedings of the European Design and Test Conference, Mar. 11, 1996, pp. 230–236).

Ramanathan et al. ("Clock distribution in general VLSI circuits", IEEE, IEEE Transactions on Circuits and Systems I: Fundamental Theory and Applications, vol. 41, No. 5, pp. 395–404, May 1994).

Wu et al. ("Effective Buffer Insertion of Clock Tree for High–Speed VLSI Circuits", Microelectronics Journal, vol. 23, No. 4, pp. 291–300, Jul. 1, 1992).

Tufte, "CML III Bipolar Standard Cell Library", Proceedings of the 1988 Bipolar Circuits and Technology Meeting, Minneapolis, Minnesota, Sep., 1988, pp. 180–182.

*Primary Examiner*—Kevin J. Teska
*Assistant Examiner*—Phallaka Kik
*Attorney, Agent, or Firm*—Charles A. Johnson; Mark T. Starr; Nawrocki, Rooney & Silvertson, P.A.

[57] ABSTRACT

A method and apparatus for distributing clock drivers within a hierarchical circuit design, wherein the clock drivers are concentrated in locations where they are actually needed rather than uniformly distributed throughout the circuit design. In an exemplary embodiment, the actual clock loads within a selected hierarchical region are determined, and a sufficient number of clock drivers are added as children objects to the selected hierarchical region. Since many placement tools may place the children objects within an outer boundary of the corresponding parent object, the clock drivers, as children objects of the selected hierarchical region, may be placed within the outer boundary of the selected hierarchical region. Accordingly, the clock drivers may be concentrated in the locations where actually needed.

33 Claims, 14 Drawing Sheets

U.S. PATENT DOCUMENTS

| | | | |
|---|---|---|---|
| 5,418,954 | 5/1995 | Petrus | 395/700 |
| 5,440,720 | 8/1995 | Baisuck et al. | 395/500 |
| 5,477,466 | 12/1995 | Tripathi et al. | 364/489 |
| 5,483,461 | 1/1996 | Lee et al. | 364/490 |
| 5,485,396 | 1/1996 | Brasen et al. | 364/491 |
| 5,490,266 | 2/1996 | Sturges | 395/500 |
| 5,490,268 | 2/1996 | Matsunaga | 395/550 |
| 5,491,640 | 2/1996 | Sharma et al. | 364/488 |
| 5,493,508 | 2/1996 | Dangelo et al. | 364/489 |
| 5,638,291 | 6/1997 | Li et al. | 364/490 |
| 5,654,897 | 8/1997 | Tripathi et al. | 364/489 |
| 5,774,371 | 6/1998 | Kawakami | 364/491 |
| 5,784,600 | 7/1998 | Doreswamy et al. | 395/558 |
| 5,798,935 | 8/1998 | Doreswamy et al. | 364/488 |

| REGION | PROPERTY |
|--------|----------|
| A | LOAD |
| B | LOAD |
| C | NULL |
| D | FIXED |
| F | GENERATE |
| G | NULL |

FIG. 8

METHOD AND APPARATUS FOR DISTRIBUTING A CLOCK TREE WITHIN A HIERARCHICAL CIRCUIT DESIGN

CROSS REFERENCE TO CO-PENDING APPLICATIONS

The present application is related to U.S. patent application Ser. No. 08/789,026, filed Jan. 26, 1997, entitled "Method and Apparatus for Selecting Components Within a Circuit Design Database", which is assigned to the assignee of the present invention and is hereby incorporated by reference.

BACKGROUND OF THE INVENTION

1. Field of the Invention

The present invention generally relates to the generation of clock trees for circuit designs, and more particularly relates to a method and apparatus for distributing clock drivers within a hierarchical circuit design.

2. Description of the Prior Art

The advancement of integrated circuit, printed circuit board and other related technologies is progressing at a very rapid rate. The latest generation of integrated circuits can incorporate over four times the circuitry than was possible just a few years ago. Further, circuit board and multi-chip module technology has allowed much denser circuit board designs. These and other advancements have allowed the development of increasingly complex and high speed computer systems.

The design of such computer systems has become increasingly difficult and time consuming. To maximize performance and minimize the size and power of such computer system, system designers often implement much of the hardware in a number of integrated circuits. For maximum performance, the integrated circuits are often custom or semi-custom designed. Each integrated circuit may contain several hundred thousand gates, and each gate must be placed and routed in accordance with an overall computer system specification, all on a die typically measuring less than 625 mils on a side.

The overall system specification typically defines the overall function of the computer system, including the power and timing requirements thereof. Because of the size and complexity of such computer systems, system designers often partition the overall design into a number of blocks, wherein each of the blocks performs a dedicated function. Partitioning is typically continued until the size of each of the sub-blocks is of a manageable size. A specification for each of the sub-blocks is then written to define the function, timing and power requirements thereof. Often, several of the sub-blocks are implemented in an integrated circuit.

Most circuit design databases are hierarchical in nature. Thus, a circuit design database may include a number of regions, including a first level region. The first level region may reference a number of second level regions. A higher level region is typically called the parent of each of the next lower level regions. Likewise, the lower level regions are typically called the children of the corresponding higher level region. The lowest level in the design hierarchy typically includes only basic library components (e.g. leaf cells).

Once the design is described in a detailed form the circuit design may be placed and routed on a scaled representation of an integrated circuit die. This may be accomplished using an automatic place and route tool. However, because automatic placement tools may not yield an optimum design solution, particularly for high performance designs that have strict timing and physical requirements, circuit designers often manually place critical circuit objects (e.g. cells and/or regions). This may be accomplished by using a commercially available placement tool (also known as a floor planning tool), typically implemented in software. The placement tool may include a graphics terminal that displays various information about the circuit design, often in several different windows.

Using a placement tool, circuit designers may perform preliminary placement by first placing selected regions. In some placement tools, the outer boundaries of the regions are appropriately sized to accommodate all underlying objects. Thus, the circuit designer may rely on an automated placement tool to place the underlying objects within the outer boundary. If more detailed placement is required because of timing, physical or other constraints, selected lower level regions or cells may be manually placed by the circuit designer.

Each integrated circuit typically includes a clock tree. The clock tree distributes one or more clock signals throughout the design. A primary goal of a clock tree is to minimize clock skew between clocked elements. That is, clock skew may reduce the time allowed for certain logic paths within the design, and thus may reduce the performance of the design. Thus, for high performance designs that have strict timing requirements, it is often critical to minimize clock skew.

To minimize clock skew, typical clock trees include a number of clock drivers that are symmetrically and evenly placed on the integrated circuit die. There may be a number of first level drivers, which may receive a clock signal from an input buffer, and may be placed near the center of the integrated circuit. Each of the first level drivers may drive a number of second level drivers. Typically, each of the first level drivers will drive the same number of second level drivers. This is intended to maintain a matched load therebetween. The number of second level drivers may be symmetrically and evenly placed on the integrated circuit die.

A typical clock tree may include a number of levels of clock drivers. The number of clock drivers in the last level is typically sufficient to drive all of the clock loads within the design. Like all other levels, the last level of clock drivers is typically placed symmetrically and evenly throughout the integrated circuit die.

In many cases, all of the clock drivers are pre-placed on the integrated circuit die. This allows the clock drivers to be placed at any desired location on the integrated circuit die. This allows the clock tree to be evenly distributed and balanced. The routing between clock drivers may also be pre-placed and balanced.

Designing and constructing a clock tree is often a time-consuming task, requiring significant design resources. Therefore, it is common for only one "worst case" clock tree to be designed. The "worst case" clock tree may then be used in each integrated circuit within a system, while still maintaining an acceptable clock skew.

After the "worst case" clock tree is designed and preplaced, the circuit designer may use a placement tool to manually place selected regions or cell of the circuit design. Thereafter, an automatic place and route tool may be used to place the remaining cells, and route the design according to the overall design specifications.

The above clock tree generating scheme has a number of limitations, some of which are described below. First, each of the clock drivers in the last level of the clock tree may have a limited drive capability, and thus may only drive a limited number of clock loads (e.g. registers, flip-flops, etc.). To use the same clock tree for multiple integrated circuit designs, and as described above, the clock tree may have to be designed to accommodate the number of clock loads in the "worst case" integrated circuit design. Because the same 'worst case' clock tree may be used for all integrated circuits within the system, many of the integrated circuits may be populated with more clock drivers than are actually required. This is especially limiting when the number of clock drivers that are required varies dramatically between circuit designs. These extra clock drivers may consume die area and power that could otherwise be used to implement the logical design.

Second, and because the clock tree is generally symmetrically and evenly distributed throughout the integrated circuit die, the circuit designer typically must restrict the number of clock loads that are placed in a given region. That is, since only a set number of clock drivers are typically available in any one region, the circuit designer may not generally over-populate one region of the integrated circuit die with regions or cells that have high clock loads. This limitation sometimes forces the circuit designer to place clock loads within regions that contain available clock drivers, even if this reduces the performance of the system. Moreover, the circuit designer may not realize that a region has too many clock loads until after the automatic place and route step, or during a full verification step. This, in turn, may require another pass through the layout cycle.

SUMMARY OF THE INVENTION

The present invention overcomes many of the disadvantages of the prior art by providing a method and apparatus for distributing clock drivers within a hierarchical circuit design, wherein the clock drivers are concentrated in locations where they are actually needed rather than uniformly distributed throughout the circuit design. In an exemplary embodiment, the actual clock loads within a selected hierarchical region are determined, and a sufficient number of clock drivers are added as children objects to the selected hierarchical region. Since many placement tools place children objects within an outer boundary of a corresponding parent objects the clock drivers, as children objects, may be placed within the outer boundary of the selected hierarchical region. Accordingly, the clock drivers may be concentrated in the locations where they are actually needed.

In a preferred embodiment, the clock tree may include seven levels of clock drivers. The first four levels are pre-placed to evenly distribute the clock signal throughout the integrated circuit design. However, the fifth through seventh levels are concentrated in the locations where they are actually needed. By using the above-described hybrid approach, clock skew may be controlled while allowing a flexible clock tree that can be tailored to meet the needs of individual designs.

An exemplary embodiment of the present invention may generate portions of a clock tree by- calculating the appropriate number of clock drivers to add to a selected region of a circuit design; adding the calculated number of clock drivers to the selected region, and placing the added clock drivers within the selected region.

In a preferred embodiment of the present invention, each object (e.g. regions and leaf cells) within the circuit design may have a property attached thereto. Exemplary property types include a load property type, a fixed property type, a null property type and a generate property type. The load property type may indicate that the corresponding object presents a single clock load. The fixed property type may indicate that the corresponding object has the required number of clock drivers already instantiated. The null property type may indicate that all clock loads in the corresponding region may be made visible to the next higher level in the circuit design hierarchy. Finally, the generate property type may indicate that the total number of clock loads for all regions residing either in or below the corresponding region may be calculated, and an appropriate number of clock drivers may be added as children cells thereto. Thus, clock drivers are typically only added to those regions that have a generate property type. The other property types may aid in the calculation of the total number of clock loads for the region having a generate property type.

BRIEF DESCRIPTION OF THE DRAWING:

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 8 is a table showing the exemplary property types that are associated with the regions shown in FIG. 7;

DETAILED DESCRIPTION OF THE PREFERRED EMBODIMENTS

Figure 1:
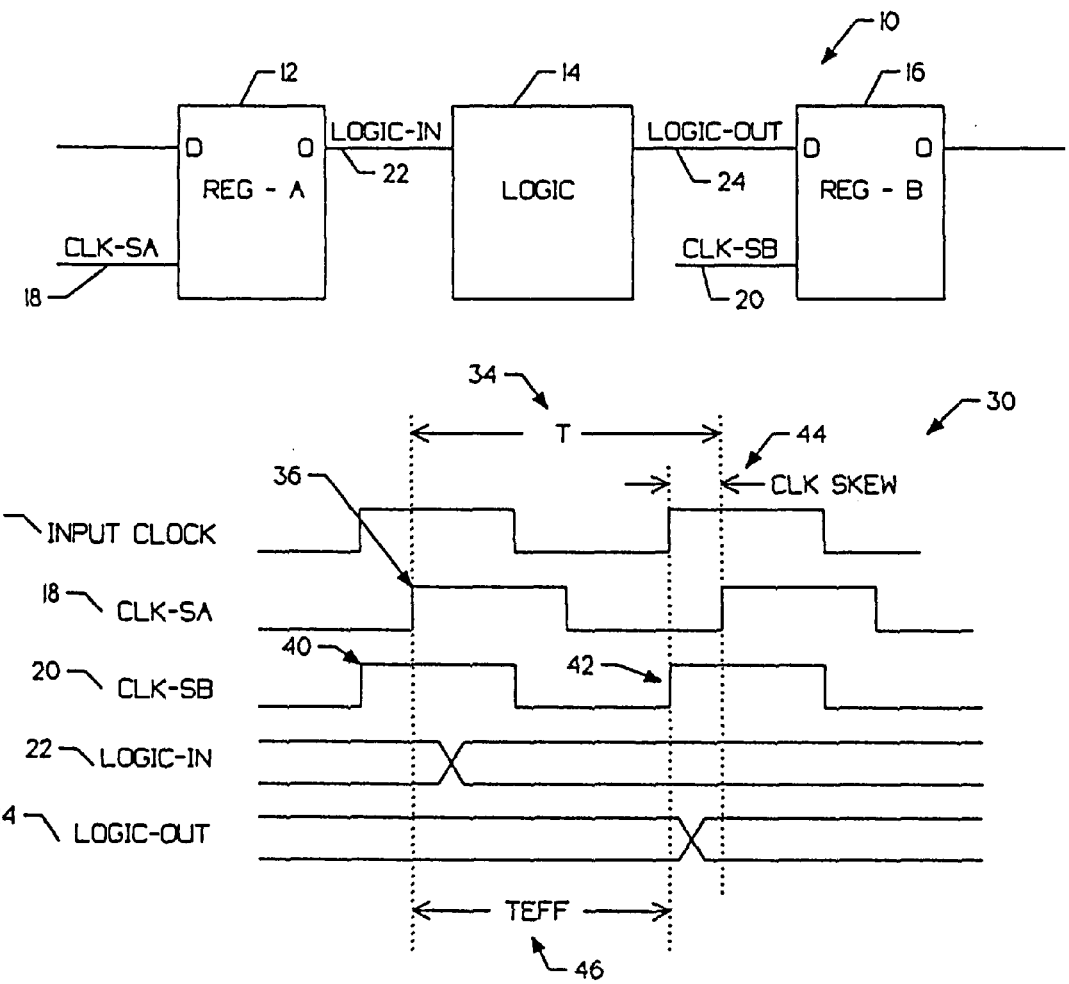
FIG. 1 is a diagram illustrating a reduction in the effective clock period between registers caused by clock skew.

FIG. 1 is a diagram illustrating a reduction in the effective clock period between registers caused by clock skew. An illustrative timing path is shown at 10, and a timing diagram therefor is shown at 30. The timing path includes a first rising edge triggered register 12, a second rising edge triggered register 16, and a logic block 14 therebetween. The first register 12 is clocked by a first clock signal 18 and the second register 16 is clocked by a second clock signal 20.

With reference to the timing diagram 30, an input clock is shown at 32. The input clock 32 is assumed to be the clock that is provided to an integrated circuit. The first clock signal 18 and the second clock signal 20 are generated from the input clock signal 32 via a clock tree or the like. The timing diagram 30 shows that the first clock signal 18 is skewed relative to the second clock signal 20, as shown at 44. This clock skew may be caused by an improperly designed clock tree.

On the rising edge 36 of the first clock signal 18, the first register 12 may release data to the logic block 14 via the logic-in signal 22. The data flows through the logic block 14 and arrives at the data input of the second register 16 via the logic-out signal 24. The data must arrive at the second register 16 before the rising edge 42 of the second clock signal 20 for the data to be latched into the second register 16.

The CLK-SA signal 18 has a clock period "T" as shown at 34. However, because of the clock skew 44 between the first and second clock signals, the effective clock period "Teff" 46 between the rising edge 36 of the first clock signal 18 and the subsequent rising edge 42 of the second clock signal 20 is less than the clock period "T" 34. This effectively reduces the time allowed for the data to pass through the logic block 14, and thus may reduced the performance of the logic path.

For the above reasons, a primary goal of a clock tree is to minimize clock skew between clocked elements. As shown above, clock skew may reduce the effective clock period for certain logic paths within the design, and thus may reduce the performance of the design. For high performance designs that have strict timing requirements, clock skew may consume a substantial portion of the total clock period.

Clock skew may have a number of other detrimental effects on the performance of a circuit design, only some of which are described below. For example, clock skew may cause hold time violations when only a small amount of logic is provided between registers. Further, clock skew may cause communication problems between integrated circuits. It should be recognized that these are only illustrative examples of effects that clock skew may have on a system.

Figure 2:
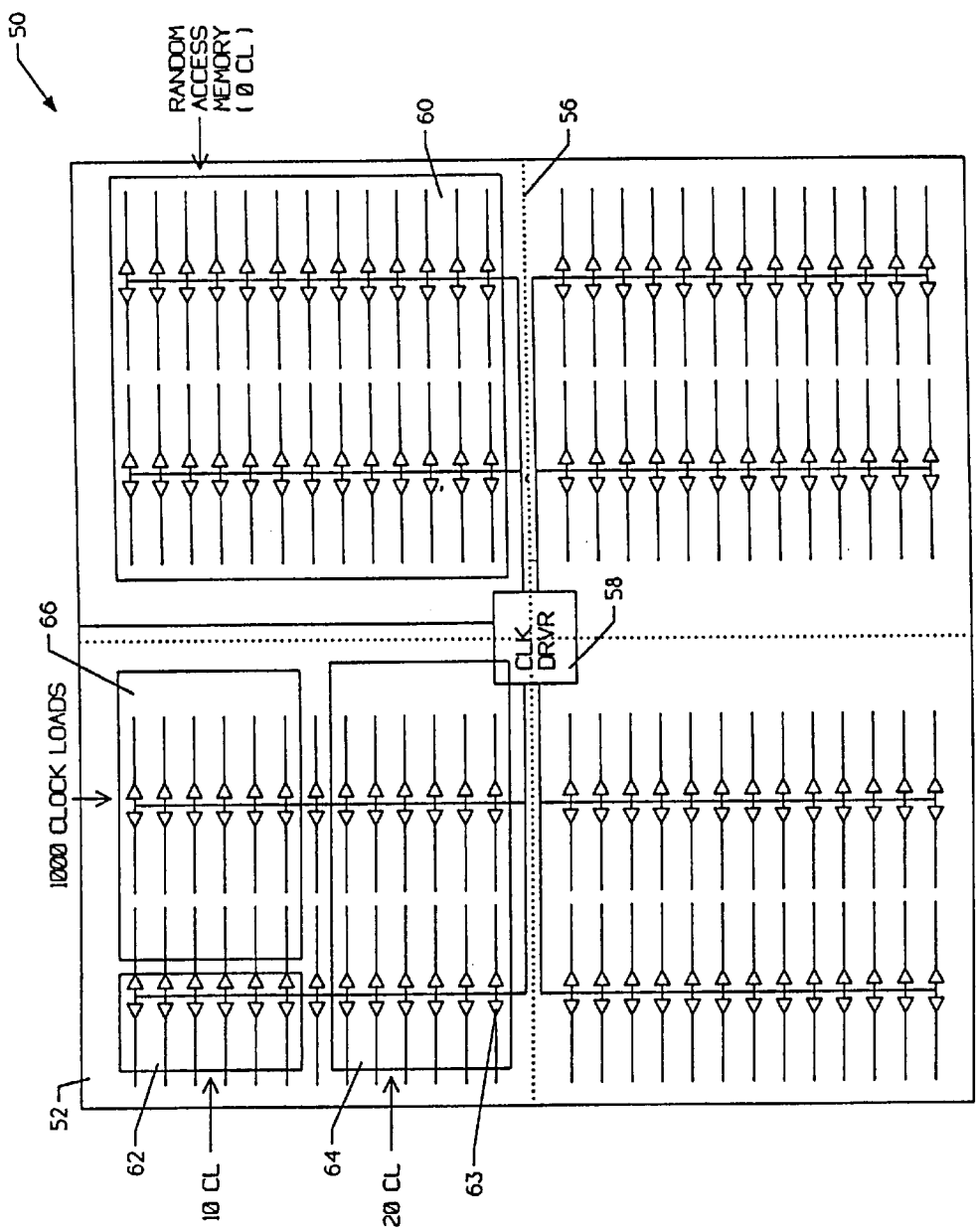
FIG. 2 is a schematic diagram illustrating a typical prior art clock tree.

FIG. 2 is a schematic diagram illustrating a typical prior art clock tree. As indicated above, each integrated circuit typically includes a clock tree. The clock tree may distribute one or more clock signals throughout the design. As indicated above, a primary goal of a clock tree is to minimize clock skew between clocked elements.

Referring to FIG. 2, typical clock trees include a number of clock drivers that are symmetrically and evenly placed on the integrated circuit die. An integrated circuit die is generally shown at 52. There may be a number of first level drivers 58, which may receive a clock signal from an input buffer (not shown), and may be placed near the center of the integrated circuit. Each of the first level drivers may drive a number of second level drivers 63. Typically, each of the first level drivers drives the same number of second level drivers as all other first level drivers. This may maintain a load match therebetween. The number of second level drivers may be symmetrically and evenly placed on the integrated circuit die, as shown. Symmetrical placement is typically used to distribute the clock signal evenly throughout the design to minimize clock skew between clocked elements.

Although the illustrative embodiment shown in FIG. 2 only shows two levels of clock drivers, it is recognized that a typical clock tree may include a number of levels of clock drivers, such that the number of clock drivers in the last level is sufficient to drive all of the clock loads within the design. Like the other levels, the clock drivers in the last level are typically placed symmetrically and evenly throughout the integrated circuit die.

In many cases, all of the clock drivers are pre-placed on the integrated circuit die. For example, the first level clock drivers 58 and the second level clock drivers (e.g. clock driver 63) may be pre-placed on the integrated circuit die. This may allow the clock drivers to be placed at any desired location on the integrated circuit die, without having to be concerned with avoiding the placement locations of other cells. This may allow the clock tree to be evenly distributed and balanced. The routing between clock drivers may also be pre-placed and balanced.

Designing and constructing a clock tree is often time-consuming, requiring significant design resources. Therefore, it is common for only one "worst case" clock tree to be designed. The "worst case" clock tree may then be used in each integrated circuit within a system, while still maintaining an acceptable clock skew.

After the "worst case" clock tree is designed and preplaced, the circuit designer may use a placement tool to manually place selected regions or cell of the circuit design. Thereafter, an automatic place and route tool may be used to place the remaining cells, and route the design according to the overall design specification.

The above clock tree generating scheme has a number of limitations, some of which are described below. First, each of the last level clock drivers, for example clock driver 63, may have a limited drive capability, and thus may only drive a limited number of clock loads. Because of this, and as described above, the clock tree may have to be designed to accommodate the number of clock loads in the "worst case" integrated circuit design. As a result, many of the integrated circuits may be populated with more clock drivers than are actually required. This is especially limiting when the number of clock drivers that are required varies dramatically between circuit designs within the system. These extra clock drivers may consume die are and power that could otherwise be used to implement the logical design.

For the integrated circuit shown at 52, a random access memory 60 may be placed in the upper-right quadrant, as shown. The random access memory 60 may not provide any clock loads to the clock tree, as it may be an asynchronous device. Thus, for the clock tree scheme shown in FIG. 2, all of the second level clock drivers that are pre-placed in the upper-right quadrant of the integrated circuit die 52 may not be required, and the die area and power consumed by those clock drivers may be wasted.

Second, and because the clock tree shown is symmetrically and evenly distributed throughout the integrated circuit die 52, the circuit designer typically must consider the number of clock loads that are placed in a given region.

In the example shown, a first region 62 may include 10 clock loads, a second region 64 may include 20 clock loads, and a third region 66 may include 1000 clock load. The die area of the first region 62 may be about ⅛ of a quadrant, the die area of the second region 64 may be about ½ of a quadrant, and the die area of the third region 66 may be about ⅜ of a quadrant, as shown.

Because the clock drivers are evenly distributed throughout the integrated circuit die, the first region 62 may have about ⅛ of the clock drivers associated with the upper-left quadrant. The second region 64 may have about ½ of the clock drivers associated with the upper-left quadrant. Finally, the third region 66 may have about ⅜ of the clock drivers associated with the upper-left quadrant. However, this distribution of clock drivers does not match the distribution of clock loads. For examples the third region 66 has over 97% of the clock loads within the quadrants but only 37.5% of the clock drivers. In this cases there may be an insufficient number of clock drivers located within the third region 66 to drive all of the clock loads associated therewith. This may force the circuit designer to place clock loads (e.g. registers and flip-flops) within regions that contain available clock drivers, even if this reduces the performance of the system. Moreover, the circuit designer may not realize that the third region 66 has too many clock loads until after the automatic place and route step, or during a full verification step. This may result in another layout iteration.

Figure 3:
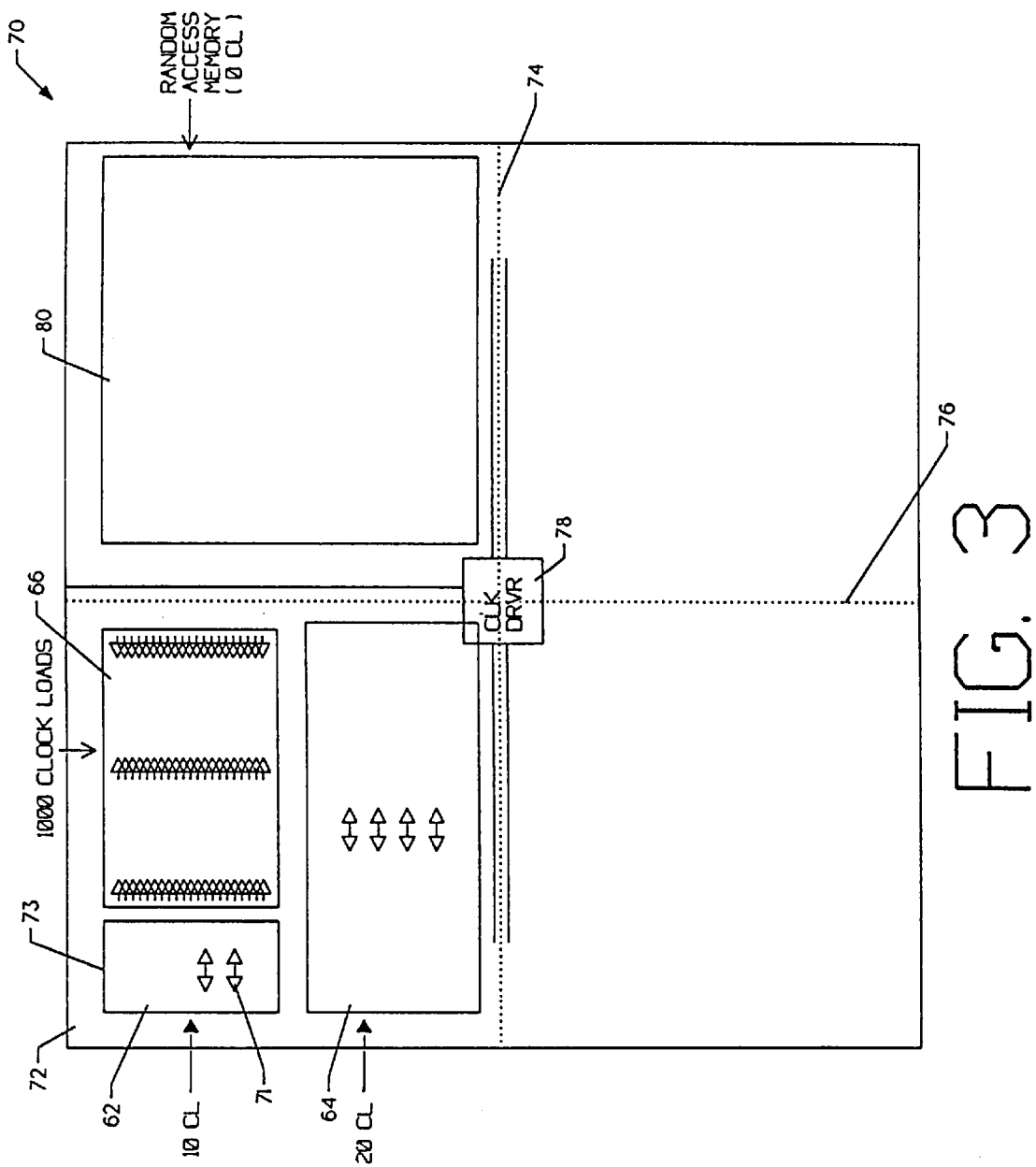
FIG. 3 is a schematic diagram illustrating a clock tree in accordance with the present invention.

FIG. 3 is a schematic diagram illustrating a clock tree in accordance with the present invention. The diagram is generally shown at 70 and shows a clock tree that concentrates at least a portion of the clock drivers at locations where they are actually needed, rather than uniformly distributed throughout the circuit design. As shown in FIG. 3, each of the first, second and third regions includes a number of second level clock drivers that are proportional to the number of clock loads therein. For example, the second region 64 has twice as many second level clock drivers than the first region 62, because the second region 64 has twice as many clock loads. Likewise, and because the RAM 80 may not require any second level clock drivers, no second level clock drivers are provided in the upper-right quadrant.

In a preferred embodiment of the present invention, the second level clock drivers may be added as children cells to each of the corresponding regions. For example, the second level drivers 71 may be added as children cells to the first region 62. Since some placement tools may place the children objects within an outer boundary of the corresponding parent object, the clock drivers 71, as children objects of the first region 62, may be placed within the outer boundary 73 of the first region 62. Accordingly, the clock drivers may be concentrated in the locations where actually needed.

Although only two levels of clock drivers are shown in FIG. 3, in a preferred embodiment the clock tree may include seven levels of clock drivers. The first four levels may be pre-placed to evenly distribute the clock signal throughout the integrated circuit design. The fifth through seventh levels, however, may be concentrated in the locations where they are actually needed as described above.

Figure 4:
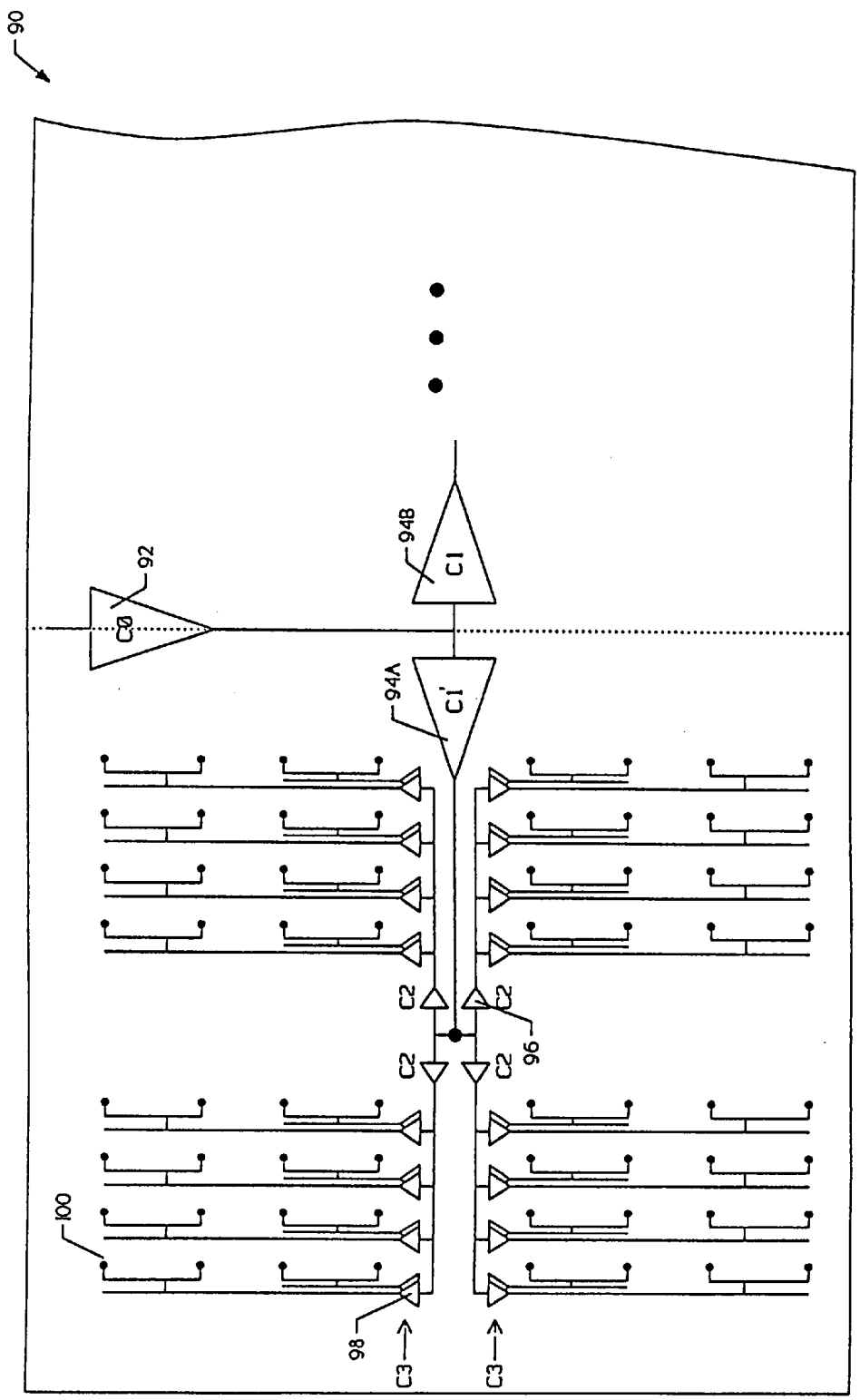
FIG. 4 is a schematic diagram of a pre-placed portion of a clock tree in accordance with the present invention.

FIG. 4 is a schematic diagram of a pre-placed portion of a clock tree in accordance with the present invention. In a preferred embodiment of the present invention, the clock tree may include seven levels of clock drivers. The first four levels may be pre-placed to evenly distribute the clock signal throughout the integrated circuit design. However, the fifth through seventh levels may be concentrated in the locations where they are actually needed, as described above. By using this approach, a flexible clock tree may be provided which allows the quantity and placement of the clock drivers to be tailored to the needs of individual designs.

A first clock driver (C0) is shown at 92, and may be positioned near or at the outer boundary of the integrated circuit die. The first clock driver 92 may provide the clock signal to a second level of clock drivers (C1). The second level of clock drivers, including clock drivers 94A and 94B, may be located near the center of the integrated circuit die. Clock driver 94A may provide the clock signal to the left half of the integrated circuit die, while clock driver 94B may provide the clock signal to the right half.

Focusing on the left half of the integrated circuit die, the second level clock driver 94A may provide the clock signal to four (4) third level clock drivers (C2), as shown for example at 96. The four (4) third level clock drivers may be centered relative to the left half of the integrated circuit die. Two of the third level clock drivers may provide the clock signal to the lower-left quadrant, and two of the third level clock drivers may provide the clock signal to the upper-left quadrant.

Focusing on the upper-left quadrant of the integrated circuits one of the third level clock drivers may provide the clock signal to the left half of the quadrant, and another one of third level clock drivers may provide the clock signal to the right half of the quadrant.

A number of fourth level clock drivers (C3) may drive the clock signal from the bottom of the upper-left quadrant in an upward direction, as shown for example at 98. In a preferred embodiment, the fourth level of clock drivers are provided in pairs, wherein a first one of the pair provides the clock signal to the upper half of the quadrant and the second one of the pair provides the clock signal to the lower half of the quadrant. Each C3 driver may be routed to tap points with equivalent metal lengths, as illustrated at 100. The fourth level clock driver pairs may be equally spaced across the upper-left quadrant.

As indicated above, and in a preferred embodiment, the first through fourth levels of clock drivers are pre-placed. This may help control clock skew across the integrated circuit. However, a fifth, sixth and seventh level of clock drivers (C4–C6) (not shown in FIG. 4) may be added to selected regions, and thus may concentrate these drivers in the locations where they are actually needed, as described above.

It is contemplated that a routing tool may connect each of the added C4 and C5 drivers to a maximum number of clock loads. The maximum number of clock loads may be determined, at least in part, by the overall net lengths load-limit of the driver, cross-talk limits, etc. In the preferred embodiment, each C3 tap point may be routed to at most two C4 drivers. Each C4 driver may then drive up to six C5 drivers. Finally, each register macro may contain a built in C6 driver to internally drive the register clock inputs. The C5 drivers may drive at most six register macro inputs.

By using the above-described hybrid approach, clock skew may be controlled while allowing a flexible clock tree that can be tailored to meet the needs of individual designs.

Figure 5:
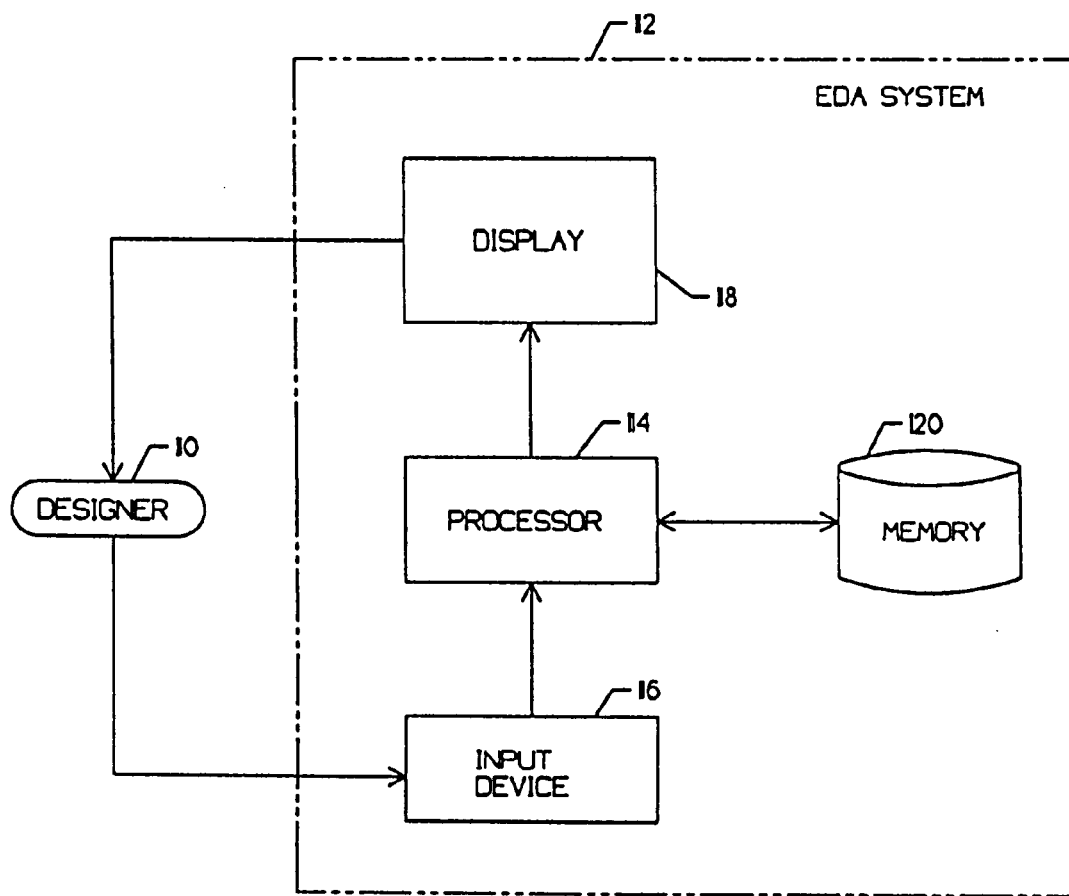
FIG. 5 is a block diagram of the computer-based environment of the present invention.

FIG. 5 is a block diagram of the computer-based environment of the present invention. The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Referring specifically to FIG. 3, a block diagram of the computer-based environment of the present invention is shown. A Designer 110 interacts with an electronic design automation (EDA) System 112 to enter an integrated circuit design, validate the design, place the design's components on a chip, and route the interconnections among the components. The integrated circuit may be an application specific integrated circuit (ASIC). The EDA System 112 includes a Processor 114, which executes operating system software as well as application programs known as EDA software. The Processor is found in all general purpose computers and almost all special purpose computers. The EDA System 112 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 110 enters design information into the EDA System by using a well-known Input Device 116 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 118. The Display is used to display messages and symbols to the Designer. Such a Display 118 may take the form of any of several well-known varieties of CRT displays. The EDA software being executed by the Processor 114 stores information relating to logic design in Memory 120. The Memory may take the form of a semiconductor memory, magnetic disks, optical disks, magnetic tape or other mass storage device.

Figure 6:
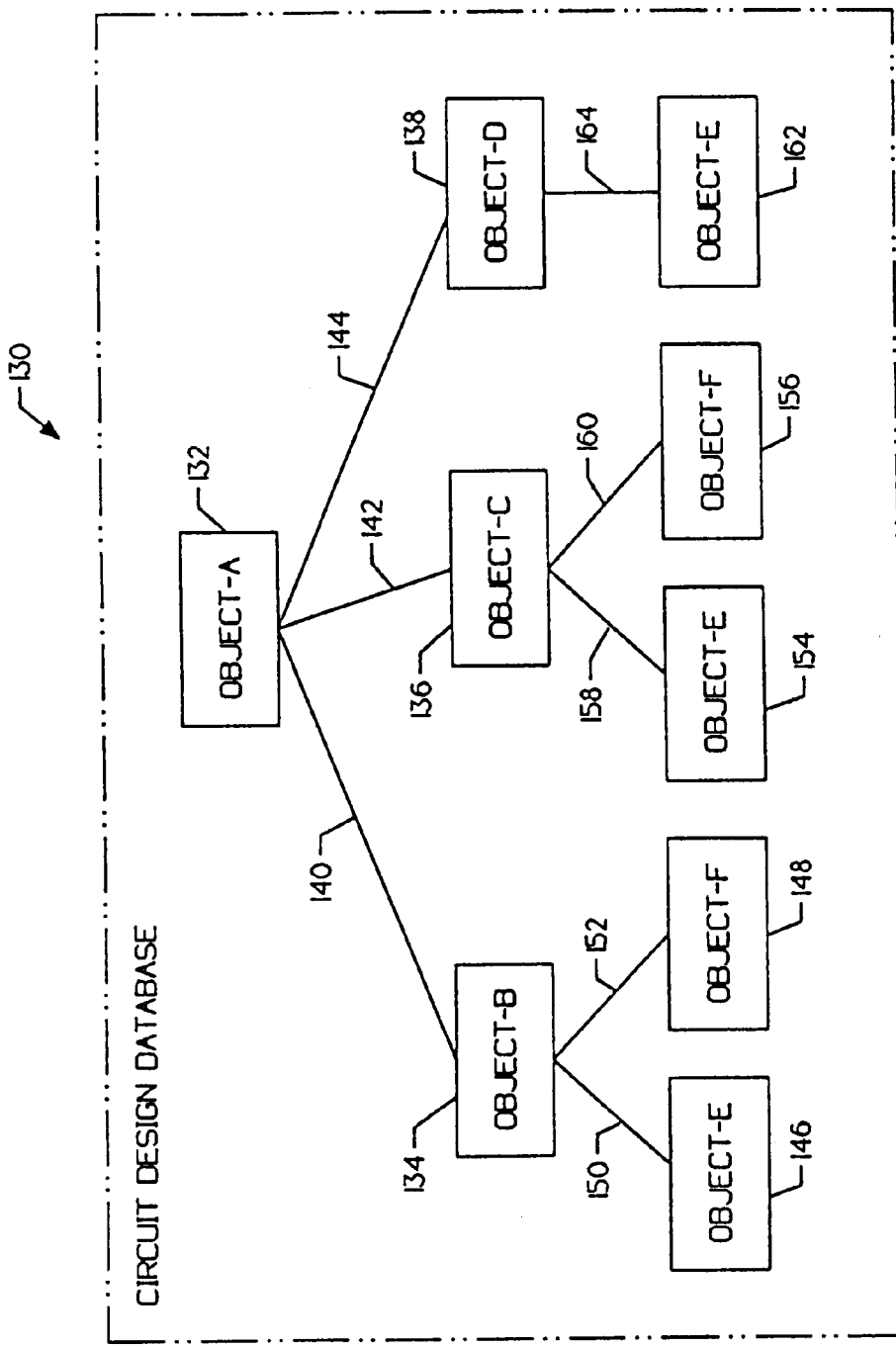
FIG. 6 is a schematic diagram showing an illustrative hierarchical circuit design database.

FIG. 6 is a schematic diagram showing a typical circuit design hierarchy, including a number of hierarchical circuit objects. The diagram is generally shown at 130. A top level object-A 132 is provided, and may represent the top hierarchial level in the exemplary circuit design database. Object-A 132 may include references to object-B 134, object-C 136, and object-D 138 as shown at 140, 142 and 144, respectively. Object-B 134, object-C 136, and object-D 138 represent the next lower level of design hierarchy in the circuit design database.

Object-B 134 may include references to object-E 146 and object-F 148 as shown at 150 and 152, respectively. Similarly, object-C 136 may include references to object-E 154 and object-F 156, as shown at 158 and 160, respectively. Finally, object-D 138 may include a reference to object-E 162, as shown at 164. Objects 146, 148, 154, 156 and 162 represent the lowest level in the design hierarchy of the circuit design database, and may be "leaf cells". That is, objects 146, 148, 154, 156 and 162 may be components from a vendor provided cell library.

It is noted that the same object, for example object-E, may be referenced by object-B 134, object-C 136, and object-D 138. To distinguish object-E 146, object-E 154 and object-E 162 from one another, a unique instance name may be provided, thereby allowing each object to be uniquely identified. Similarly, object-F 148 and object-F 156 may be provided with a unique instance name.

It is recognized that in practice, the circuit design database is typically much more complex, containing many more levels of design hierarchy and thousands of objects and/or cells. That is the circuit design database shown in FIG. 6 is only presented to illustrate the basic structure of a typical circuit design database.

Figure 7:
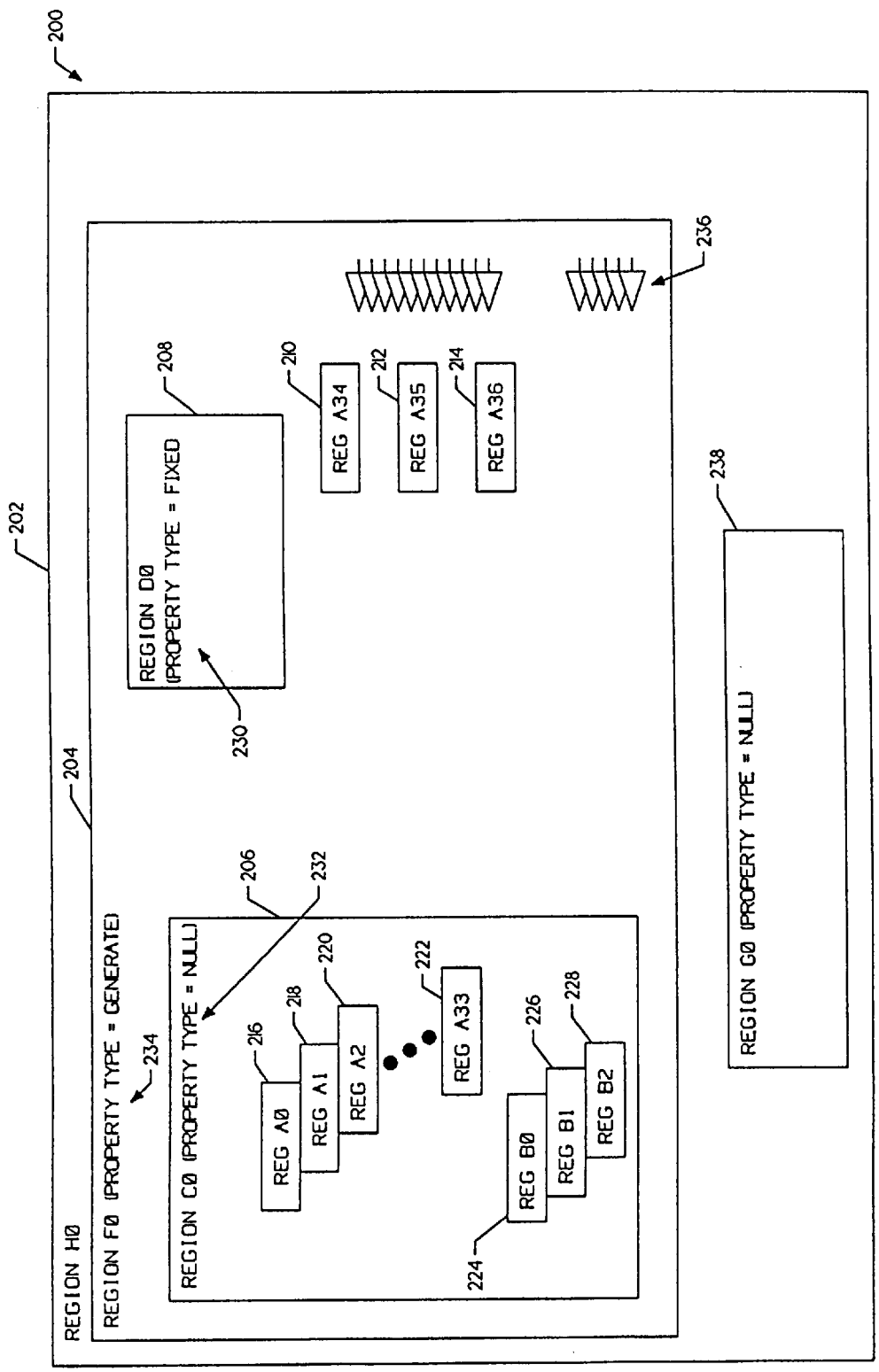
FIG. 7 is a block diagram showing an exemplary method for generating and placing clock drivers within a circuit designs in accordance with the present invention.

FIG. 7 is a block diagram showing an exemplary method for generating and placing clock drivers within a circuit design, in accordance with the present invention. The diagram is generally shown at 200 and includes a number of hierarchical regions including region H0 202, F0 204, G0 238, C0 206, D0 208, and registers A0–A33, B0–B2 and A34–36.

As indicated above, an exemplary embodiment of the present invention may generate portions of a clock tree by: calculating the appropriate number of clock drivers to add to a selected region of a circuit design; adding the calculated number of clock drivers to the selected region, and placing the added clock drivers within the selected region. By using this approach, a flexible clock tree may be provided which allows the quantity and placement of the clock drivers to be tailored to the needs of individual designs.

In a preferred embodiment of the present invention, each object (e.g. regions and leaf cells) within a circuit design may have a property attached thereto. Exemplary property types include a load property type, a fixed property type, a null property type and a generate property type. The load property type may indicate that the corresponding object presents a single clock load. The fixed property type may indicate that the corresponding object has the required number of clock drivers already instantiated. The null property type may indicate that the number of clock loads must be calculated for the corresponding region. That is, all clock loads in the corresponding region may be made visible to the next higher level in the circuit design hierarchy. Finally, the generate property type may indicate that the total number of clock loads for all regions residing either in or below the corresponding region must be calculated, and an appropriate number of clock drivers should be added as children cells thereto. Thus, clock drivers are typically only added to those regions that have a generate property type. The other property types may aid in the calculation of the total number of clock loads for the region having a generate property type.

Once the property types are assigned to each leaf cell and region in the circuit design, the present invention may begin counting clock loads at the lowest level in the design hierarchy (e.g. at the leaf-cell level). This is continued, while working up the design hierarchy and incrementing the clock load count as specified by the above-referenced properties. Once a region having a generate type property is encountered, the present invention may insert an appropriate number of clock drivers, as children cells, into that region. The number of clock drivers that are inserted may be calculated using predefined equations, and may be a function of the clock load count. After the drivers are inserted, the present invention may move up the design hierarchy, and treat the region that acquired the clock drivers as requiring no further clock drivers (i.e. it becomes "fixed").

Referring specifically to FIG. 7, the present invention begins counting clock loads at the lowest level in the design hierarchy. In this case, the load count for leaf cells A0–A33 216–222 and B0–B2 224–228 within region C0 206 are counted. Since these are leaf cell storage elements, they are considered by default to each have a clock load of one. Thus, the load count within region C0 206 is set to 37 (34 "A" loads and 3 "B" loads). Since region C0 206 has a null property type, as shown at 232, the present invention may continue up the hierarchy to region F0 204, without adding drivers to region C0 206. Within region F0 204, the present invention may continue counting clock loads. The three leaf cells A34–A36 210–214 may add three loads to the count. Region D0 208 has a fixed property type. Thus, no more loads need be added to the load count. It should be noted that preferably, whenever modules of types "fixed" or "load" are encountered, the downward trace of those branches within the design hierarchy are discontinued, and those modules below it need not be processed. Thus, the total clock load count within region F0 is 40 (37 for region C0 206, 3 for leaf cells A34–36 210–214, and 0 for region D0 208).

Upon processing region F0 204, a generate property type is encountered for the first time. As such, a number of drivers may be added as children to region F0 204, as shown at 236. The number of drivers that are added may be calculated by using a number of predetermined equations. In a preferred embodiment, the number of C5 drivers that are added is given by the expression C5=(total count/6)×1.2+3. The first term may be rounded up when it is not an integer. In the present example, eleven (11) C5 drivers may be added to region F0 204. Similarly, the number of C4 drivers that are added is given by the expression C4=(total C5 drivers added/6)×1.2+3. Thus, in the present example, five (5) C5 drivers may be added to region F0 204.

It should be noted that the above equations used for calculating the number of C4 and C5 drivers are entirely arbitrary. Each is independent from the other, and can be any algebraic expression the user desires. The equations are attached to each 'generate' type module as parameters, and thus can be different from module to module.

The present invention may then move up the hierarchy to region H0 202. From this level, region F0 204 is deemed to not present any clock loads, since all required clock loads have already been provided for within region F0 204, as described above. Thus, the region H0 202 load count will be set to the load count obtained from region G0 238, which has a property type of null.

Preferably, a preprocessing algorithm is executed which begins at the top of the design hierarchy and scans downward. Whenever a module of type 'generate' is encountered, it and all logic beneath it are treated as an independent generation task. When a generation task is completed, as described above, the module is treated as "fixed" by the modules that reside above it in the design hierarchy.

FIG. 8 is a table showing the exemplary property types that are associated with the regions shown in FIG. 7. The diagram is generally shown at 250. A first column 252 shows each of the regions of FIG. 7, and a second column 254 shows the corresponding property types. For example, leaf cells "A" 216–222 have a load property type, by default designating a clock load value of one. That is, and in the exemplary embodiment, leaf cell storage elements may be automatically categorized as having a load property type with a value of one, and a property need not be attached thereto. Region C0 206 may have a property type of null, indicating that the clock loads therein are made visible to the next higher level in the hierarchy. Finally, region F0 204 may have a property type of generate, indicating that an appropriate number of clock drivers should be added thereto, as described above.

Figure 9:
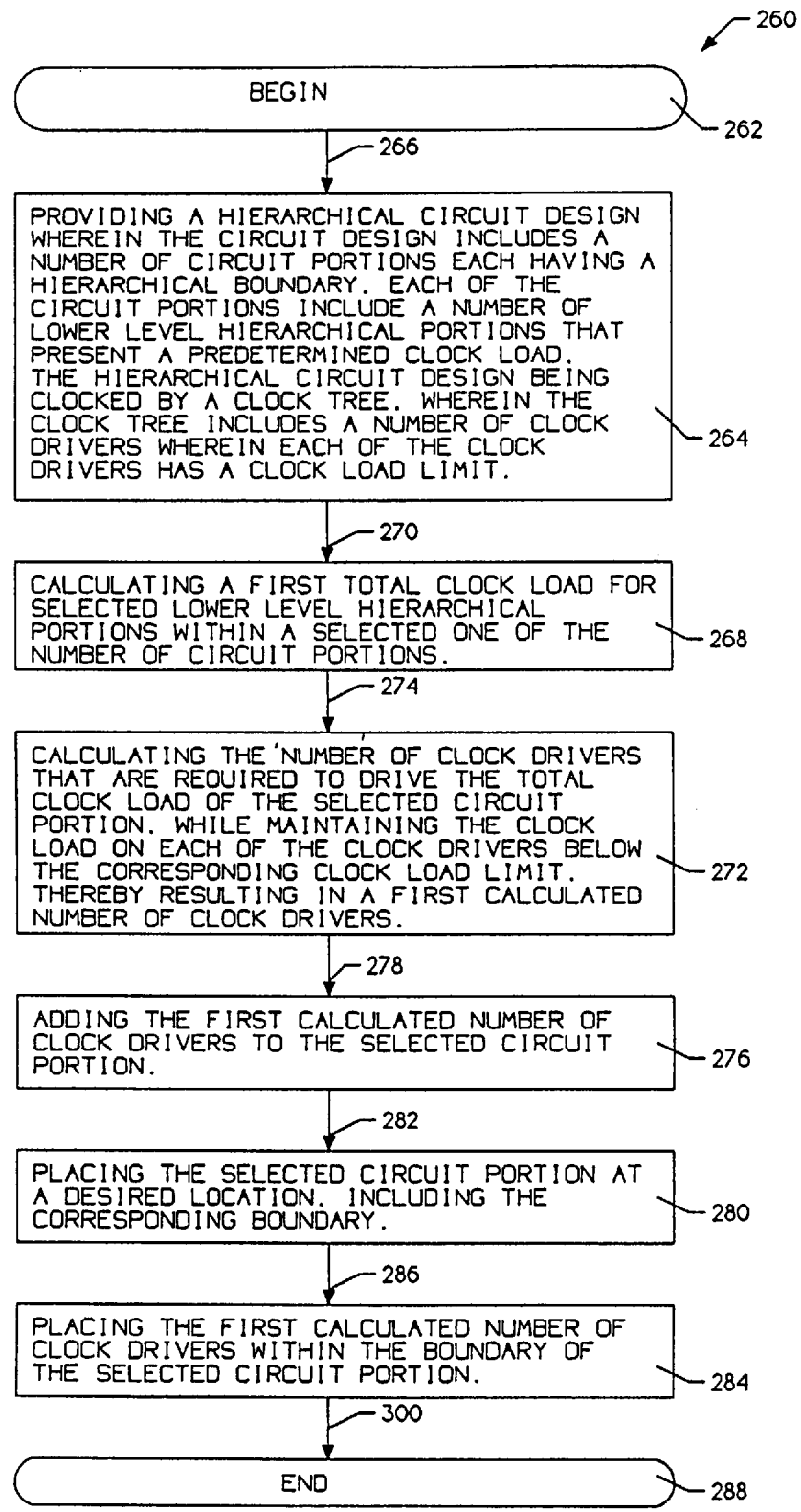
FIG. 9 is a flow diagram showing a first illustrative method of the present invention.

FIG. 9 is a flow diagram showing a first illustrative method of the present invention. The diagram is generally shown at 260, and is entered at element 262. Control is passed to element 264 via interface 266. Element 264 provides a hierarchical circuit design, including a number of circuit portions. Each of the number of circuit portions have a hierarchical boundary. Selected ones of the circuit portions further include a number of lower level hierarchical portions that present a predetermined clock load. The hierarchical circuit design is clocked by a clock tree that includes a number of clock drivers. Each of the clock drivers has a clock load limit.

Control is passed to element 268 via interface 270. Element 268 calculates a first total clock load for selected lower level hierarchical circuit portions within a selected one of the number of circuit portions. Control is then passed to element 272 via interface 274. Element 272 calculates the number of clock drivers that are required to drive the total clock load of the selected circuit portion, while maintaining the clock load on each of the clock drivers below the corresponding clock load limit. This may result in a first calculated number of clock drivers. Control is passed to element 276 via interface 278. Element 276 adds the first calculated number of clock drivers to the selected circuit portion. Control is then passed to element 280 via interface 282. Element 280 places the selected circuit portion at a desired location, including the corresponding boundary. Control is then passed to element 284 via interface 286. Element 284 places the first calculated number of clock drivers within the boundary of the selected circuit portion. Control is then passed to element 288 via interface 300, wherein the algorithm is exited.

Figure 10A:
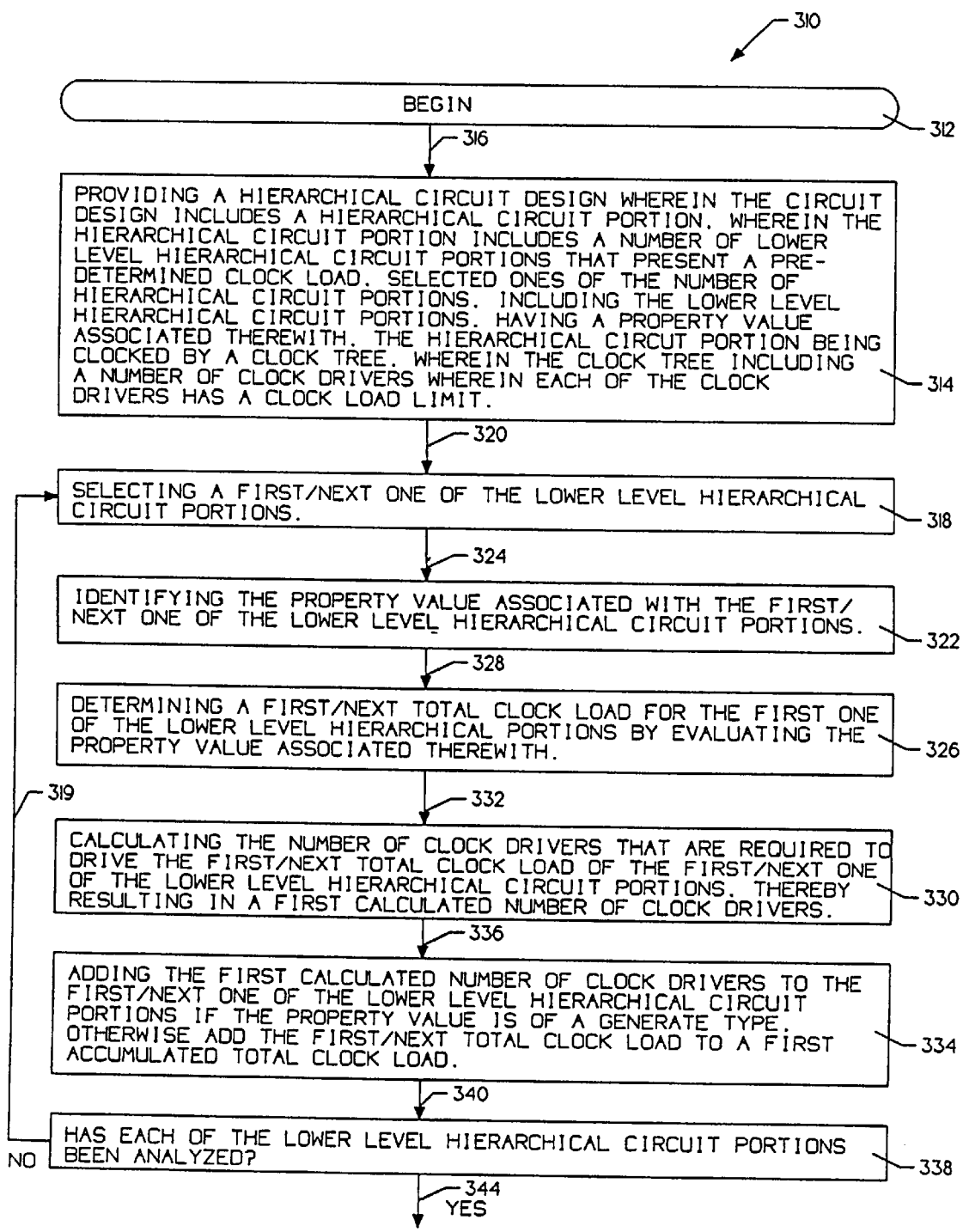
FIGS. 10A–10B show a flow diagram of a second illustrative method of the present invention.
Figure 10B:
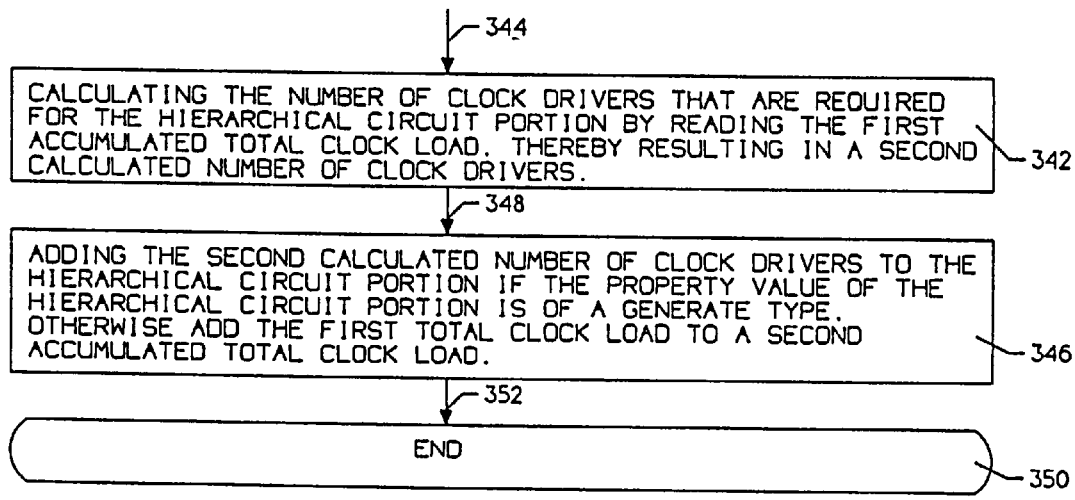

FIGS. 10A–10B show a flow diagram of a second illustrative method of the present invention. The algorithm is generally shown at 310, and is entered at element 312. Control is passed to element 314 via interface 316. Element 314 provides a hierarchical circuit design including a hierarchical circuit portion, wherein the hierarchical circuit portion includes a number of lower level hierarchical circuit portions that may present a predetermined clock load. Selected ones of the number of hierarchical circuit portions, including the lower level hierarchical circuit portions, have a property value associated therewith. The hierarchical circuit design is clocked by a clock tree, wherein the clock tree includes a number of clock drivers wherein each of the clock drivers has a clock load limit. Control is passed to element 318 via interface 320.

Element 318 selects a first/next one of the lower level hierarchical circuit portions. Control is then passed to element 322 via interface 324. Element 322 identifies the property value associated with the first/next one of the lower level hierarchical circuit portions. Control is then passed to element 326 via interface 328. Element 326 determines a first/next total clock load for the first one of the lower level hierarchical circuit portions by evaluating the property value associated therewith. Control is then passed to element 330 via interface 332. Element 330 calculates the number of clock drivers that are required to drive the first/next total clock load of the first/next one of the lower level hierarchical circuit portions, thereby resulting in a first calculated number of clock drivers. Control is then passed to element 334 via interface 336. Element 334 adds the first calculated number of clock drivers to the first/next one of the lower level hierarchical circuit portions if the property value is of a "generate" type. Otherwise, element 334 adds the first/next total clock load to a first accumulated total clock load. Control is then passed to element 338 via interface 340. Element 338 determines whether each of the lower level hierarchical circuit portions has been analyzed. If each of the lower level hierarchical circuit portions has not been analyzed, control is passed back to element 318 via interface 319. If, however, each of the lower level hierarchical circuit portions has been analyzed, control is passed to element 342 via interface 344.

Element 342 calculates the number of clock drivers that are required for the hierarchical circuit portion by reading the first accumulated total clock load, thereby resulting in a second calculated number of clock drivers. Control is passed to element 346 via interface 348. Element 346 adds the second calculated number of clock drivers to the hierarchical circuit portion if the property value of the hierarchical circuit portion is of a "generate" type. Otherwise element 346 adds the first total clock load to a second accumulated clock load. Control is then passed to element 350 via interface 352e wherein the algorithm is exited.

Figure 11A:
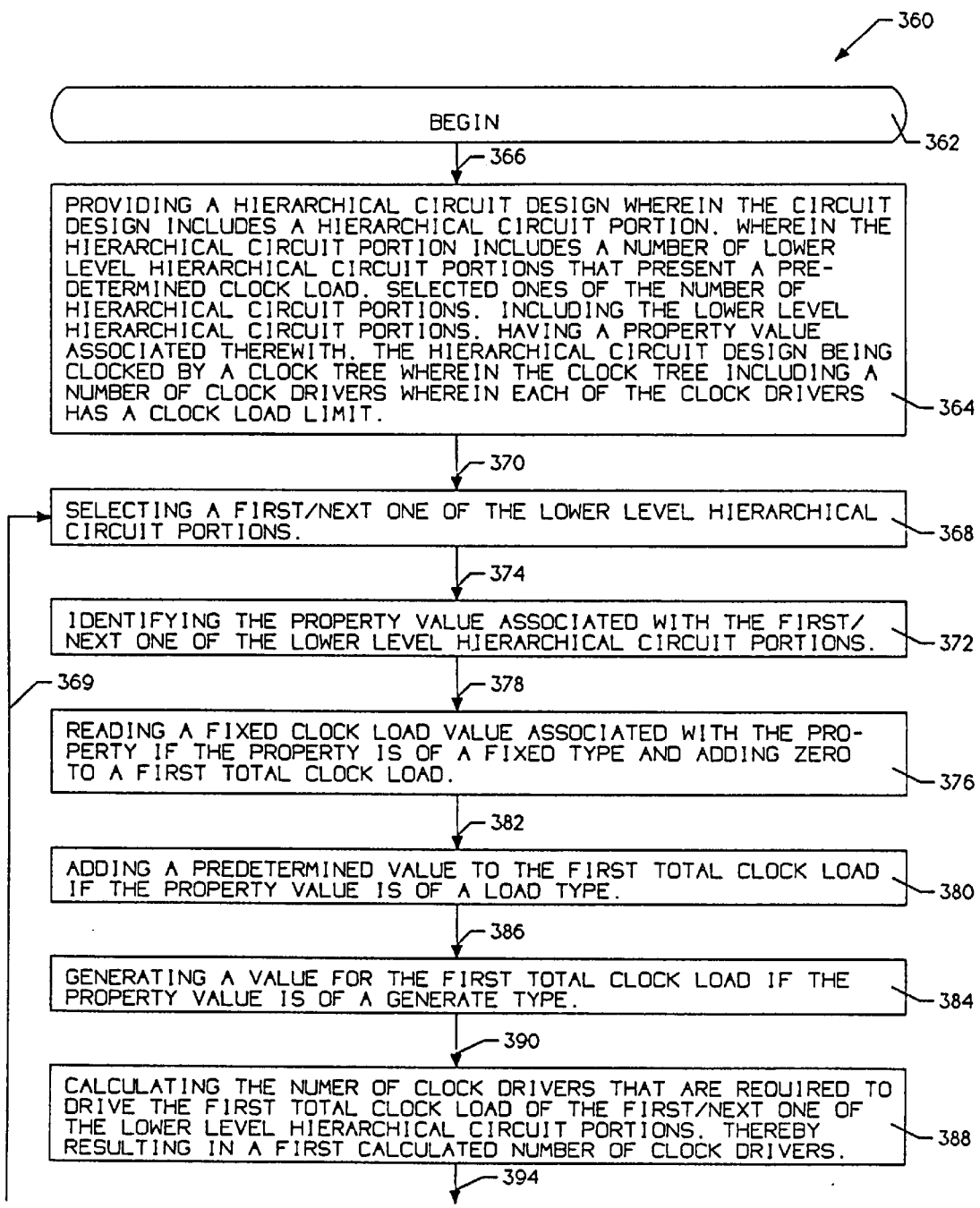
FIGS. 11A–11B show a flow diagram of a third illustrative method of the present invention.
Figure 11B:
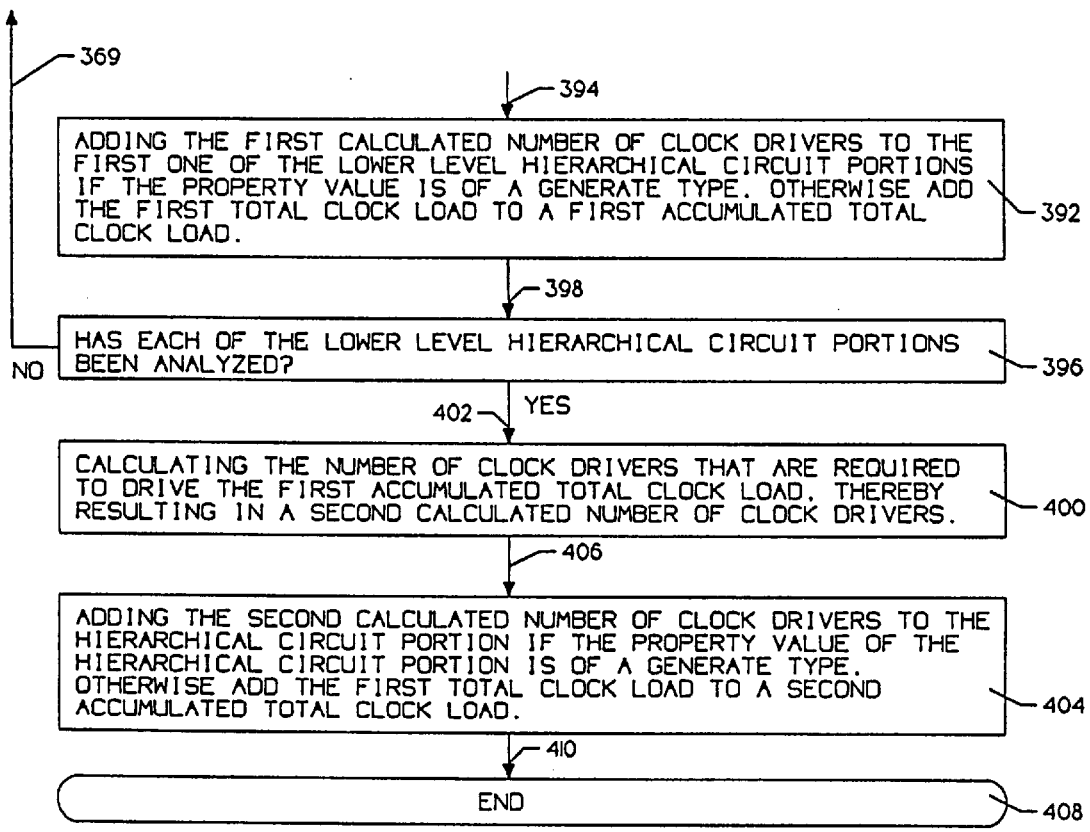

FIGS. 11A–11B show a flow diagram of a third illustrative method of the present invention. The algorithm is generally shown at 360, and is entered at element 362. Control is passed to element 364 via interface 366. Element 364 provides a hierarchical circuit design that includes a hierarchical circuit portion. The hierarchical circuit portion may include a number of lower level hierarchical circuit portions that may present a predetermined clock load. Selected ones of the number of hierarchical circuit portions, including the lower level hierarchical circuit portions have a property value associated therewith. The hierarchical circuit design is clocked by a clock tree, wherein the clock tree includes a number of clock drivers. Each of the clock drivers has a clock load limit. Control is passed to element 368 via interface 370.

Element 368 selects a first/next one of the lower level hierarchical circuit portions. Control is then passed to element 372 via interface 374. Element 372 identifies the property value associated with the first/next one of the lower level hierarchical circuit portions. Control is then passed to element 376 via interface 378. Element 376 reads the property and identifies if the property is of a "fixed" type. If the property is of a fixed type, element 376 adds zero to a first total clock load. Control is then passed to element 380 via interface 382.

Element 380 adds a predetermined value to the first total clock load if the property value is of a "load" type. The predetermined value is typically a value of one. Control is then passed to element 384 via interface 386. Element 384 generates a value for the first total clock load if the property value is of a "generate" type. Control is then passed to element 388 via interface 390.

Element 388 calculates the number of clock drivers that are required to drive the first total clock load of the first/next one of the lower level hierarchical circuit portions, thereby resulting in a first calculated number of clock drivers. Control is then passed to element 392 via interface 394. Element 392 adds the first calculated number of clock drivers to the first one of the lower level hierarchical circuit portions, if the property value is of a generate type. Otherwise, element 392 adds the first total clock load value to a first accumulated total clock load value. Control is then passed to element 396 via interface 398. Element 396 determines whether each of the lower level hierarchical circuit portions has been analyzed. If each of the lower level hierarchical circuit portions has not been analyzed control is passed back to element 368 via interface 369. If, however, each of the lower level hierarchical circuit portions has been analyzed, control is passed to element 400 via interface 402.

Element 400 calculates the number of clock drivers that are required to drive the first accumulated total clock load, thereby resulting in a second calculated number of clock drivers. Control is then passed to element 404 via interface 406. Element 404 adds the second calculated number of clock drivers to the hierarchical circuit portion if the property value of the hierarchical circuit portion is of a "generate" type. Otherwise, element 404 adds the first total clock load to a second accumulated total clock load value. Control is then passed to element 408 via interface 410, wherein the algorithm is exited.

Figure 12:
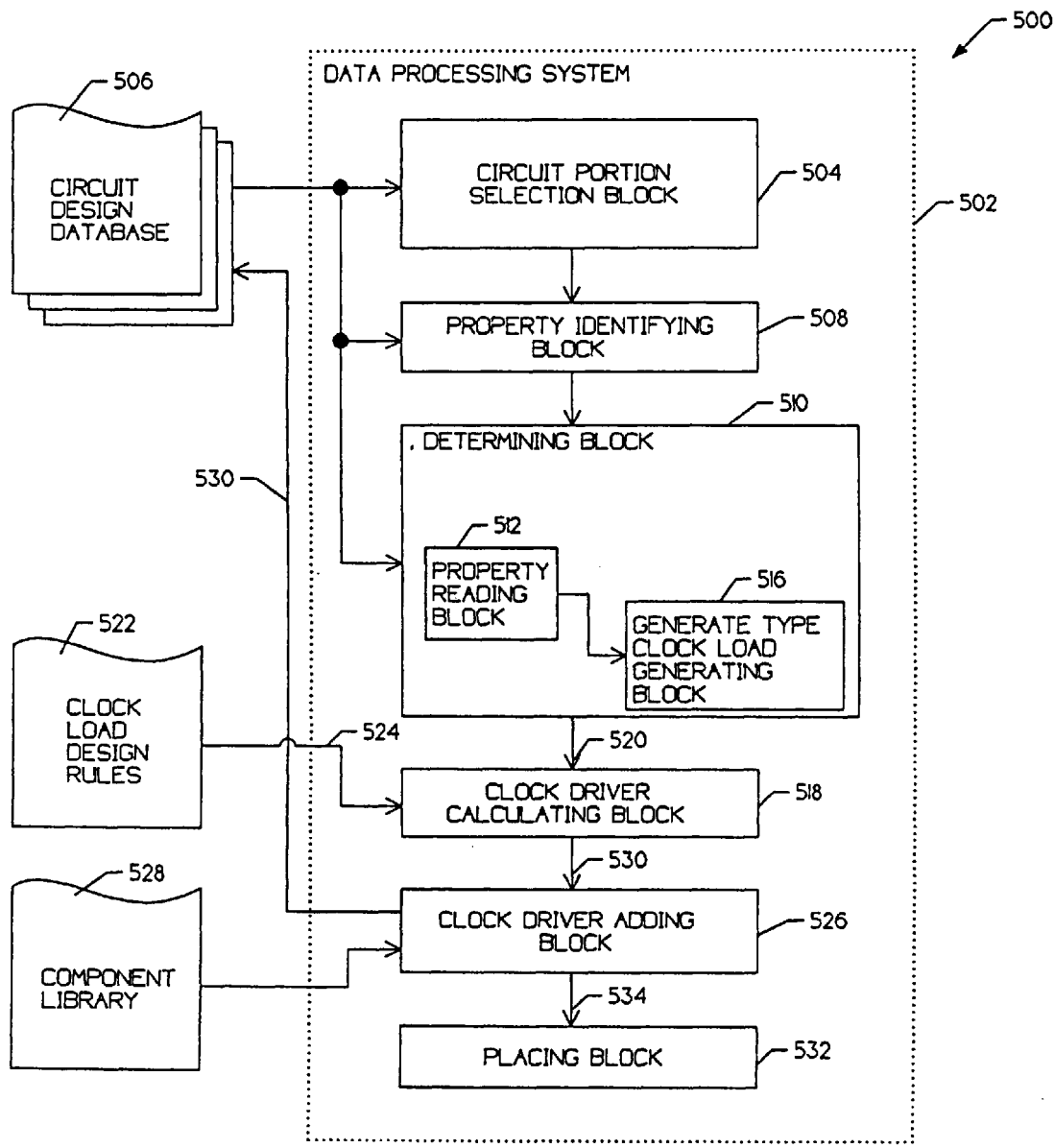
FIG. 12 shows an exemplary data processing system in accordance with the present invention.

FIG. 12 shows an exemplary data processing system 502 in accordance with the present invention. The diagram is generally shown at 500. A data processing system 502 may include a circuit portion selection block 504. a property identifying block 508, a determining block 510, a clock driver calculating block 518, a clock driver adding block 526 and a placing block 532.

The circuit portion selection block 504 may read a hierarchical circuit design database 506, and may select a circuit portion therein. In a preferred embodiment, the circuit portion selection block 504 begins at the lowest level in the hierarchy of the circuit design database, and continues up the hierarchy.

Once a circuit portion is selected, the property identifying block 508 may identify a property associated with the selected circuit portion. This may be accomplished by reading the circuit design database 506. Each of the circuit portions in the circuit design database 506 may have one of a number of predefined properties associated therewith. In a preferred embodiment, the predefined properties include a load property, a fixed property, a null property, and a generate property type.

After the property has been identified for the selected circuit portion, the determining block 510 may determine the number of clock loads that are associated with the selected circuit portion. The determining block 510 may include a property reading block 512 and a generate type clock load generating block 516. The property reading block 512 may read the value of the property that is associated with the selected circuit portion. If the property type is of a load type, a single clock load is determined by default. If the property type is of a fixed type, it is noted that drivers are already included in this module and no additional drivers are required. If the property type is of a null type, the number of clock loads presented by the circuit portion is made visible to the next higher level in the design hierarchy. The determining block 510 may maintain an accumulated tally of the total number of clock loads in the selected circuit portion.

The execution of the circuit portion selection block 504, the property identifying block 508 and the determining block 510 may continue, while moving up the circuit design hierarchy. Meanwhile, the determining block 510 may tally a total clock load value for all circuit portions processed until a generate property type is detected by the property reading block 512.

If the property reading block 512 identifies a circuit portion that has a generate property type, the generate type clock load generating block 516 may provide control to the clock driver calculating block 518. The clock driver calculating block 518 may calculate the number of clock drivers that are required to drive the total clock loads that have been accumulated and stored. The clock driver calculating block 518 may read a clock load design rule file 522 via interface 524. The clock load design rule file 522 may provide information to determine the appropriate number of clock drivers that are required to drive the total clock loads.

After the appropriate number of clock drivers has been calculated, the clock driver adding block 526 may add the appropriate number of clock drivers to the circuit portion that has the generate property type associated therewith. The clock driver adding block 526 may select appropriate clock drivers from a component library 528, as shown. In a preferred embodiment, the clock drivers are added as children cells to the circuit portion having the generate property type. The clock driver adding block 526 may record the addition of the clock drivers in the circuit design database 506, via interface 530.

Thereafter, the placing block 532 may place the added clock drivers within an outer boundary of the circuit portion that had the generate property type. Accordingly, the clock drivers may be concentrated in the locations where actually needed. By using this approach, a flexible clock tree may be provided which allows the quantity and placement of the clock drivers to be tailored to the needs of individual designs.

Having thus described the preferred embodiments of the present invention, those of skill in the art will readily appreciate that the teachings found herein may be applied to yet other embodiments within the scope of the claims hereto attached.

What is claimed is:

1. A method for providing a clock tree for a hierarchical circuit design wherein the circuit design includes a number of circuit portions each having a hierarchical boundary, the clock tree including a number of clock drivers wherein each of the clock drivers has a clock load limit, and wherein each of the circuit portions include a number of lower level hierarchical portions that present a predetermined clock load, the method comprising the steps of:

a. calculating a first total clock load for selected lower level hierarchical portions within a selected one of the number of circuit portions;

b. calculating the number of clock drivers that are required to drive the total clock load of the selected circuit portion, while maintaining the clock load on each of the clock drivers below the corresponding clock load limit, thereby resulting in a first calculated number of clock drivers;

c. adding the first calculated number of clock drivers to the selected circuit portion;

d. placing the selected circuit portion at a desired location, including the corresponding boundary; and e. placing the first calculated number of clock drivers within the boundary of the selected circuit portion.

2. A method according to claim 1 further comprising the step of attaching a property to each of the lower level hierarchical portions.

3. A method according to claim 2 wherein the property for selected ones of the lower level hierarchical portions indicates a fixed clock load values which is by default zero.

4. A method according to claim 3 wherein said calculating the number of clock drivers step calculates the number of clock drivers that are required to drive the total clock load of the selected circuit portion by adding the fixed clock load value of the selected ones of the lower level hierarchical portions with remaining clock loads of the selected circuit portion.

5. A method according to claim 2 wherein the property for selected ones of the lower level hierarchical portions indicates a load value.

6. A method according to claim 5 wherein said calculating step calculates the number of clock drivers that are required to drive the total clock load of the selected circuit portion by adding a predetermined value for the selected ones of the lower level hierarchical portions with the remaining clock load of the selected circuit portion.

7. A method according to claim 2 wherein the property for selected ones of the lower level hierarchical portions indicates a generate value.

8. A method according to claim 7 wherein a generated number of clock drivers are added to the selected lower level hierarchical portions.

9. A method according to claim 8 wherein said calculating the number of clock drivers step calculates the number of clock drivers that are required to drive the total clock load of the selected circuit portion by adding zero for the selected ones of the lower level hierarchical portions with the remaining clock load of the selected circuit portion.

10. A method according to claim 8 wherein the number of clock drivers are added to the selected lower level hierarchical portions by:

a. calculating a second total clock load for a selected lower level hierarchical portion;

b. calculating the number of clock drivers that are required to drive the total clock load of the selected lower level hierarchical portion, while maintaining the clock load on each of the clock drivers below the corresponding clock load limit, thereby resulting in a second calculated number of clock drivers; and c. adding the second calculated number of clock drivers to the selected lower level hierarchical portion.

11. A method according to claim 10 further comprising the steps of:

d. placing the selected lower level hierarchical portion, including a corresponding boundary; and e. placing the second calculated number of clock drivers within the boundary of the selected lower level hierarchical portion.

12. A method according to claim 1 wherein each of the number of clock drivers is a leaf cell, including each of the first calculated number of clock drivers.

13. A method according to claim 1 wherein said calculating step calculates the number of clock drivers that are required to drive the total clock load of the selected circuit portion, beginning at the lowest level in the design hierarchy.

14. A method according to claim 1 wherein said adding step adds the first calculated number of clock drivers to the selected circuit portion, and stores the first calculated number of clock drivers in a corresponding circuit design database.

15. A method according to claim 1 wherein said placing step (d) is performed by a circuit designer in a placement tool.

16. A method according to claim 1 wherein said placing step (d) is automatically performed by an automatic placement tool.

17. A method according to claim 1 wherein said placing step (e) is performed by a circuit designer in a placement tool.

18. A method according to claim 1 wherein said placing step (e) is automatically performed by an automatic placement tool.

19. A method according to claim 1 further comprises the step of routing the clock tree by routing a number of clock nets between the number of clock drivers and the number of clock loads.

20. A method according to claim 19 wherein said routing step routes the number of clock nets such that each of the clock drivers does not exceed the corresponding clock load limit.

21. A method according to claim 19 wherein said routing step is performed by a automatic routing tool.

22. A method for providing a clock tree for a hierarchical circuit design wherein the circuit design includes a hierarchical circuit portion, wherein the hierarchical circuit portion includes a number of lower level hierarchical circuit portions that present a predetermined clock load, selected ones of the number of hierarchical circuit portions, including the lower level hierarchical circuit portions, having a property value associated therewith, the clock tree including a number of clock drivers wherein each of the clock drivers has a clock load limit, the method comprising the steps of:

a. selecting a first one of the lower level hierarchical circuit portions, b. identifying the property value associated with the first one of the lower level hierarchical circuit portions;

c. determining a first total clock load for the first one of the lower level hierarchical portions by evaluating the property value associated therewith;

d. calculating the number of clock drivers that are required to drive the first total clock load of the first one of the lower level hierarchical circuit portions, thereby resulting in a first calculated number of clock drivers;

e. adding the first calculated number of clock drivers to the first one of the lower level hierarchical circuit portions if the property value is of a generate types otherwise add the first total clock load to a first accumulated total clock load; and f. repeat steps (a)–(e) for each of the lower level hierarchical circuit portions.

23. A method according to claim 22 further comprising the steps of:

g. calculating the number of clock drivers that are required for the hierarchical circuit portion by reading the first accumulated total clock load, thereby resulting in a second calculated number of clock drivers; and h. adding the second calculated number of clock drivers to the hierarchical circuit portion if the property value of the hierarchical circuit portion is of a generate types otherwise add the first total clock load to a second accumulated total clock load.

24. A method for providing a clock tree for a hierarchical circuit design wherein the circuit design includes a hierarchical circuit portion, wherein the hierarchical circuit portion includes a number of lower level hierarchical circuit portions that present a predetermined clock load, selected ones of the number of hierarchical circuit portions, including the lower level hierarchical circuit portions, having a property value associated therewith, the clock tree including a number of clock drivers wherein each of the clock drivers has a clock load limit, the method comprising the steps of:

a. selecting a first one of the lower level hierarchical circuit portions;

b. identifying the property value associated with the first one of the lower level hierarchical circuit portions;

c. determining a first total clock load for the first one of the lower level hierarchical portions by:

i. reading a fixed clock load value associated with the property if the property value is of a fixed type, and assigning a value of zero to a first total clock load;

ii. assigning a predetermined value as the first total clock load if the property value is of a load type;

iii. generating a value for the first total clock load if the property value is of a generate type;

d. calculating the number of clock drivers that are required to drive the first total clock load of the first one of the lower level hierarchical circuit portions, thereby resulting in a first calculated number of clock drivers;

e. adding the first calculated number of clock drivers to the first one of the lower level hierarchical circuit portions if the property value is of a generate type, otherwise add the first total clock load to a first accumulated total clock load;

f. repeat steps (a)–(e) for each of the lower level hierarchical circuit portions;

g. calculating the number of clock drivers that are required for the hierarchical circuit portion by reading the first accumulated total clock load, thereby resulting in a second calculated number of clock drivers; and h. adding the second calculated number of clock drivers to the hierarchical circuit portion if the property value of the hierarchical circuit portion is of a generate type, otherwise add the first total clock load to a second accumulated total clock load.

25. A method according to claim 24 further comprising the steps of:

d. placing each of the lower level hierarchical circuit portions at desired locations, including a corresponding boundary associated with each lower level hierarchical circuit portion; and e. placing the calculated number of clock drivers for each of the lower level hierarchical circuit portion that have a property of a generate type, within the corresponding boundary of the corresponding lower level hierarchical circuit portion.

26. A data processing system for providing a clock tree for a hierarchical circuit design wherein the circuit design includes a number of circuit portions each having a hierarchical boundary, the clock tree including a number of clock drivers wherein each of the clock drivers has a clock load limit, and wherein each of the circuit portions include a number of lower level hierarchical portions that present a predetermined clock load, the data processing system comprising:

a. determining means for determining a first total clock load for selected lower level hierarchical portions within a selected one of the number of circuit portions;

b. calculating means coupled to said determining means for calculating the number of clock drivers that are required to drive the total clock load of the selected circuit portion, while maintaining the clock load on each of the clock drivers below the corresponding clock load limit, thereby resulting in a first calculated number of clock drivers;

c. adding means coupled to said second calculating means for adding the first calculated number of clock drivers to the selected circuit portion, d. placing means for placing the selected circuit portion at a desired location, including the corresponding boundary, said placing means further placing the first calculated number of clock drivers within the boundary of the selected circuit portion.

27. A data processing system for providing a clock tree for a hierarchical circuit design wherein the circuit design includes a hierarchical circuit portion, wherein the hierarchical circuit portion includes a number of lower level hierarchical circuit portions that present a predetermined clock load, selected ones of the number of hierarchical circuit portions, including the lower level hierarchical circuit portions, having a property value associated therewith, the clock tree including a number of clock drivers wherein each of the clock drivers has a clock load limit, the data processing system comprising:

a. selecting means for selecting a first one of the lower level hierarchical circuit portions;

b. identifying means coupled to said selecting means for identifying the property value associated with the first one of the lower level hierarchical circuit portions;

c. determining means coupled to said identifying means for determining a first total clock load for the first one of the lower level hierarchical portions by evaluating the property value associated therewith;

d. calculating means coupled to said determining means for calculating the number of clock drivers that are required to drive the first total clock load of the first one of the lower level hierarchical circuit portions, thereby resulting in a first calculated number of clock drivers;

e. adding means coupled to said calculating means for adding the first calculated number of clock drivers to the first one of the lower level hierarchical circuit portions if the property value is of a generate type, otherwise adding the first total clock load to a first accumulated total clock load.

28. A data processing system according to claim 27 wherein said calculating means further calculates the number of clock drivers that are required for the hierarchical circuit portion by reading the first accumulated total clock load, thereby resulting in a second calculated number of clock drivers.

29. A data processing system according to claim 28 wherein said adding means further adds the second calculated number of clock drivers to the hierarchical circuit portion if the property value of the hierarchical circuit portion is of a generate type, otherwise adds the first total clock load to a second accumulated total clock load.

30. A data processing system for providing a clock tree for a hierarchical circuit design wherein the circuit design includes a hierarchical circuit portion, wherein the hierarchical circuit portion includes a number of lower level hierarchical circuit portions that present a predetermined clock load, selected ones of the number of hierarchical circuit portions, including the lower level hierarchical circuit portions, having a property value associated therewith, the clock tree including a number of clock drivers wherein each of the clock drivers has a clock load limit, the data processing system comprising:

a. selecting means for selecting a first one of the lower level hierarchical circuit portions;

b. identifying means coupled to said selecting means for identifying the property value associated with the first one of the lower level hierarchical circuit portions;

c. determining means coupled to said identifying means for determining a first total clock load for the first one of the lower level hierarchical portions, said determining means further including:

i. reading means for reading a fixed clock load value associated with the property if the property value is of a fixed type, and assigning a value of zero to a first total clock load;

ii. assigning means coupled to said reading means for assigning a predetermined value to the first total clock load if the property value is of a load type;

iii. generating means coupled to said reading means for generating a value for the first total clock load if the property value is of a generate type;

d. calculating means coupled to said determining means for calculating the number of clock drivers that are required to drive the first total clock load of the first one of the lower level hierarchical circuit portions, thereby resulting in a first calculated number of clock drivers;

e. adding means coupled to said calculating means for adding the first calculated number of clock drivers to the first one of the lower level hierarchical circuit portions if the property value is of a generate type, otherwise adding the first total clock load to a first accumulated total clock load.

31. A data processing system according to claim 30 wherein said calculating means further calculates the number of clock drivers that are required for the hierarchical circuit portion by reading the first accumulated total clock load, thereby resulting in a second calculated number of clock drivers.

32. A data processing system according to claim 31 wherein said adding means further adds the second calculated number of clock drivers to the hierarchical circuit portion if the property value of the hierarchical circuit portion is of a generate type, otherwise adds the first total clock load to a second accumulated total clock load.

33. A data processing system according to claim 32 further comprising:

a. placing means for placing each of the lower level hierarchical circuit portions at selected locations, including a corresponding boundary associated with each lower level hierarchical circuit portion, said placing means further placing the calculated number of clock drivers for each of the lower level hierarchical circuit portion that have a property of a generate type, within the corresponding boundary of the corresponding lower level hierarchical circuit portion.

\* \* \* \* \*